(12) United States Patent
Maruyama et al.

(10) Patent No.: US 11,435,204 B2
(45) Date of Patent: Sep. 6, 2022

(54) TOUCH SENSOR UNIT

(71) Applicant: MITSUBA Corporation, Gunma (JP)

(72) Inventors: Tsuyoshi Maruyama, Gunma (JP); Yasuhiro Orihara, Gunma (JP); Yohei Inagaki, Gunma (JP)

(73) Assignee: MITSUBA Corporation, Gunma (JP)

( * ) Notice: Subject to any disclaimer, the term of this patent is extended or adjusted under 35 U.S.C. 154(b) by 291 days.

(21) Appl. No.: 16/817,637

(22) Filed: Mar. 13, 2020

(65) Prior Publication Data

US 2021/0010827 A1 Jan. 14, 2021

(30) Foreign Application Priority Data

Jul. 11, 2019 (JP) .............................. JP2019-128896

(51) Int. Cl.
| | |
|---|---|
| *G01D 5/16* | (2006.01) |
| *H03K 17/96* | (2006.01) |
| *B60R 11/00* | (2006.01) |
| *E05F 15/44* | (2015.01) |

(52) U.S. Cl.
CPC ............. *G01D 5/16* (2013.01); *B60R 11/00* (2013.01); *E05F 15/44* (2015.01); *H03K 17/96* (2013.01); *E05Y 2400/54* (2013.01); *E05Y 2900/546* (2013.01); *H03K 2217/96015* (2013.01)

(58) Field of Classification Search
CPC .. G01D 5/00; G01D 5/12; G01D 5/14; G01D 5/16; G01D 5/24; G01D 5/2405; G01D 5/241; G01D 5/2412; G01D 5/2417; B60R 11/00; E05F 15/00; E05F 15/40; E05F 15/42; E05F 15/44; E05Y 2400/00; E05Y 2400/10; E05Y 2400/52; E05Y 2400/53; E05Y 2400/54; E05Y 2800/00; E05Y 2800/45; E05Y 2900/00; E05Y 2900/50; E05Y 2900/53; E05Y 2900/546; H03K 17/00; H03K 17/94; H03K 17/96; H03K 2017/9602; H03K 2017/9604;
(Continued)

(56) References Cited

U.S. PATENT DOCUMENTS

| | | | | |
|---|---|---|---|---|
| 8,493,081 B2* | 7/2013 | Bolbocianu | ........... | E05F 15/443 |
| | | | | 73/862.391 |
| 9,234,979 B2* | 1/2016 | Bolbocianu | ............ | B60J 5/0493 |
| 9,477,003 B2* | 10/2016 | Pribisic | .................. | E05F 15/46 |

(Continued)

FOREIGN PATENT DOCUMENTS

JP 2017204361 11/2017

*Primary Examiner* — Hoai-An D. Nguyen
(74) *Attorney, Agent, or Firm* — JCIPRNET

(57) ABSTRACT

The disclosure realizes a touch sensor unit including a mold part that can restrict the movement of a sensor body embedded in a sensor holder. A touch sensor unit includes a sensor body, a sensor holder in which the sensor body is embedded, and a resistor disposed outside the sensor holder and electrically connected to the sensor body. The sensor body includes a tubular insulator that is elastically deformed when an external force is applied, and a plurality of linear electrodes that are provided inside the tubular insulator and come into contact with each other as the tubular insulator is elastically deformed. At least an end of the sensor holder, an end of the tubular insulator protruding from an end surface of the sensor holder, and the resistor are molded together with a mold part which is a resin molded body.

3 Claims, 11 Drawing Sheets

(58) Field of Classification Search
CPC ....... H03K 2017/9613; H03K 2217/00; H03K 2217/94; H03K 2217/96; H03K 2217/96015
USPC ....... 324/600, 649, 658, 661, 662, 663, 686, 324/691, 519
See application file for complete search history.

(56) References Cited

U.S. PATENT DOCUMENTS

| | | | | |
|---|---|---|---|---|
| 11,225,818 | B2* | 1/2022 | Akimoto | E05F 15/44 |
| 2018/0274269 | A1* | 9/2018 | Orihara | E05B 81/78 |
| 2019/0149151 | A1* | 5/2019 | Okada | E05F 15/44 |
| | | | | 200/211 |

* cited by examiner

TOUCH SENSOR UNIT

CROSS REFERENCE TO RELATED APPLICATIONS

This application claims the priority benefit of Japanese Patent Application No. 2019-128896, filed on Jul. 11, 2019. The entirety of the above-mentioned patent application is hereby incorporated by reference herein and made a part of this specification.

BACKGROUND

Technical Field

The disclosure relates to a touch sensor unit used for detecting contact with an obstacle.

Description of Related Art

A vehicle such as an automobile may be provided with an opening/closing body (for example, a sliding door or a tailgate) for opening and closing an opening of the vehicle, and an opening/closing device for driving the opening/closing body. The opening/closing device includes an electric motor which is a drive source, and an operation switch for turning the electric motor on/off. The electric motor included in the opening/closing device operates based on the operation of the operation switch, and drives the opening/closing body to open or close. Among opening/closing devices, there are automatic opening/closing devices for driving the opening/closing body to open or close regardless of whether the operation switch is operated. One of the conventional automatic opening/closing devices includes a touch sensor unit for detecting an obstacle caught between the opening and the opening/closing body, and drives the opening/closing body based on the detection result of the touch sensor unit. For example, when an obstacle is detected by the touch sensor unit, the automatic opening/closing device drives open the opening/closing body which has been driven to close, or stops it there.

An example of the touch sensor unit as described above is described in Patent Document 1 (Japanese Patent Application Laid-Open No. 2017-204361). The touch sensor unit described in Patent Document 1 has a sensor body, and a sensor holder in which the sensor body is embedded. The sensor body includes an insulating tube and two linear electrodes provided in the insulating tube, and each linear electrode includes a core wire and a sheath covering the core wire. Further, the two linear electrodes constituting the sensor body are provided spirally in the insulating tube and intersect each other in a non-contact state.

In the touch sensor unit described in Patent Document 1, an end surface of the insulating tube, which constitutes the sensor body, and an end surface of the sensor holder are flush with each other. Specifically, the sensor holder is provided with a tunnel-shaped housing hole, and the sensor body (insulating tube) is inserted into the housing hole. Moreover, the end surface of the sensor holder, on which the housing hole opens, and the end surface of the insulating tube inserted into the housing hole are flush or substantially flush.

The core wires of the linear electrodes housed in the insulating tube are drawn out from the end surface of the insulating tube which is flush with the end surface of the sensor holder. Then, the core wire of one linear electrode is connected to one end of a resistor, and the core wire of the other linear electrode is connected to the other end of the resistor. In the following description, a part of the core wire of the linear electrode drawn out of the sensor holder from the end surface of the insulating tube may be referred to as a "connection wire" to be distinguished from other parts of the core wire. However, such distinction is merely for convenience of explanation.

An end of the touch sensor unit described in Patent Document 1 is provided with a mold part that includes at least an end of the sensor holder, the connection wire extending from the end, and the resistor to which the connection wire is connected. The mold part is a resin molded body formed by injecting molten resin into a mold with the end of the sensor holder, the connection wire, the resistor, etc. disposed therein.

The mold part described in Patent Document 1 is provided for waterproofing and protecting the end of the touch sensor unit, and sufficiently achieves such purposes. However, in the touch sensor unit described in Patent Document 1, the end surface of the insulating tube and the end surface of the sensor holder are flush with each other. For this reason, the mold part is in contact with the end surface and the outer peripheral surface of the sensor holder in the relationship with the sensor holder while the mold part is in contact with only the end surface of the insulating tube in the relationship with the insulating tube. Therefore, it is not possible to expect the mold part to function as a fixing means for restricting the movement of the sensor body including the insulating tube. Moreover, when the mold part is formed, the insulating tube may be pushed deep into the housing hole of the sensor holder by the pressure (injection pressure) of the molten resin. When the insulating tube is pushed deep into the housing hole, the molten resin may flow into the housing hole or between the inner peripheral surface of the housing hole and the outer peripheral surface of the insulating tube.

The disclosure realizes a touch sensor unit having a mold part that can restrict the movement of the sensor body embedded in the sensor holder.

SUMMARY

In one embodiment of the disclosure, a touch sensor unit is provided to include a sensor body; a sensor holder in which the sensor body is embedded; and an electrical component disposed outside the sensor holder and electrically connected to the sensor body. The sensor body includes a tubular insulator that is elastically deformed when an external force is applied, and a plurality of electrodes that are provided inside the tubular insulator and come into contact with each other as the tubular insulator is elastically deformed. Then, at least an end of the sensor holder, an end of the tubular insulator protruding from an end surface of the sensor holder, and the electrical component are molded together with resin.

According to an embodiment of the disclosure, a plurality of connection wires are provided, which are drawn out from the end of the tubular insulator and connected to the electrical component. Then, in addition to the end of the sensor holder, the end of the tubular insulator, and the electrical component, the connection wires are also molded together with resin.

According to another embodiment of the disclosure, an insulating member is provided, which is interposed between the plurality of connection wires and prevents contact between the connection wires. Then, in addition to the end of the sensor holder, the end of the tubular insulator, the electrical component, and the connection wires, the insulating member is also molded together with resin.

The disclosure realizes a touch sensor unit having a mold part that can restrict the movement of the sensor body embedded in the sensor holder.

DESCRIPTION OF THE EMBODIMENTS

Figure 1:
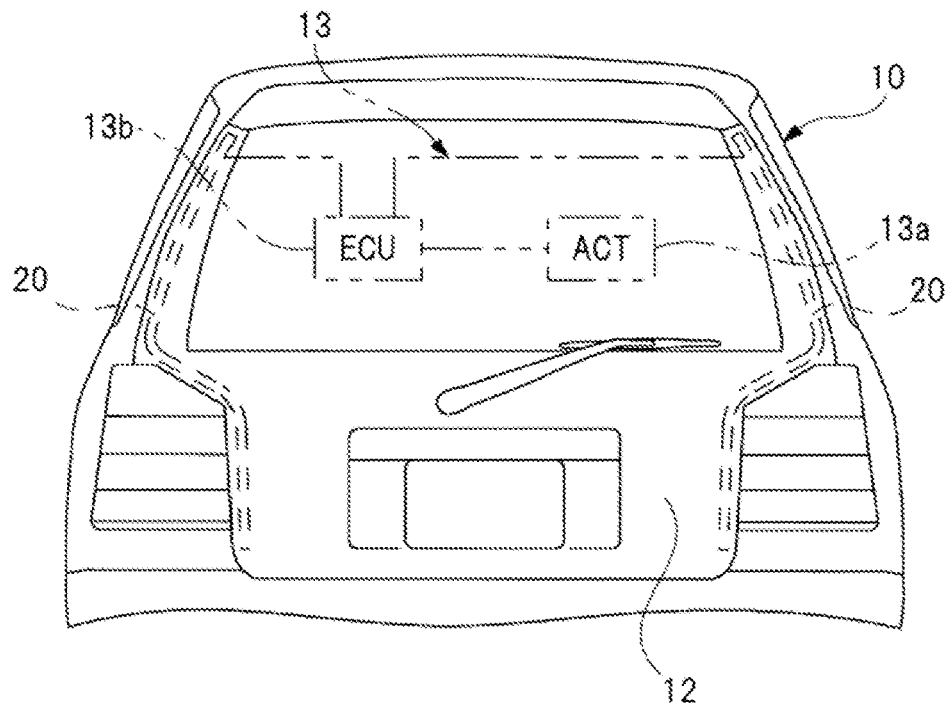
FIG. 1 is a front view showing a tailgate of a vehicle on which a touch sensor unit is mounted.
Figure 2:
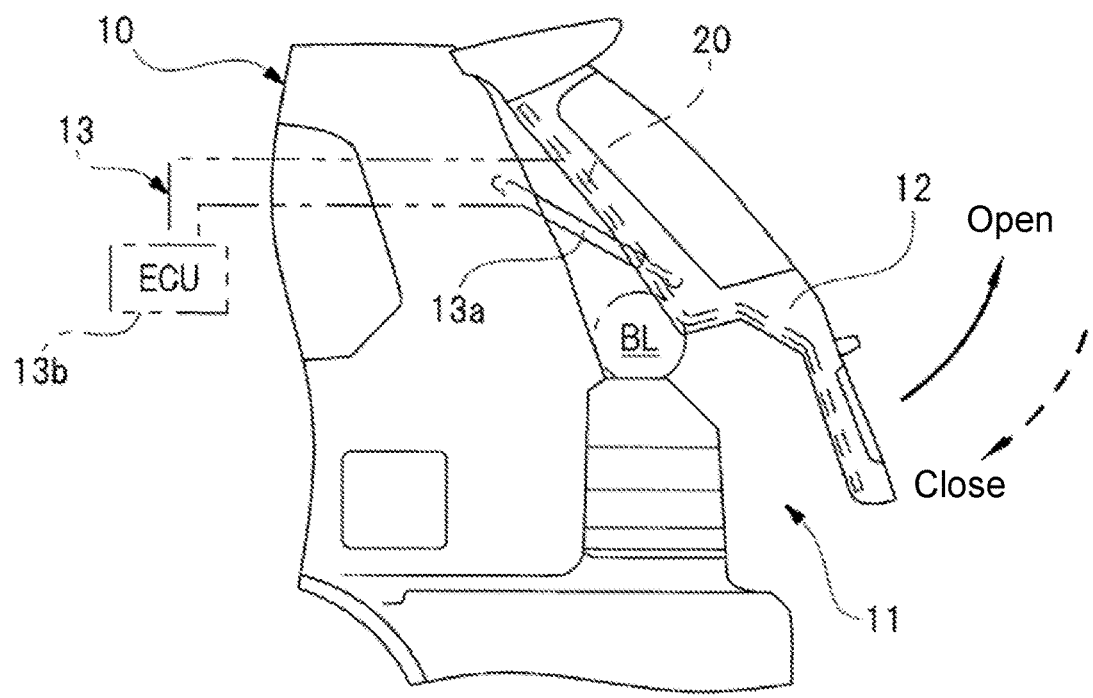
FIG. 2 is a side view showing the tailgate of the vehicle on which the touch sensor unit is mounted.

Hereinafter, an example of a touch sensor unit to which the disclosure is applied will be described in detail with reference to the drawings. As shown in FIG. 1 and FIG. 2, the touch sensor unit 20 according to the present embodiment is mounted on a vehicle 10. The vehicle 10 as shown is a so-called hatchback vehicle. The rear portion of the vehicle 10 is provided with an opening (rear opening 11) through which large luggage can be taken in and out of the vehicle interior. The rear opening 11 is opened or closed by an opening/closing body 12 that is rotatably supported by a hinge (not shown) provided on the rear side of the vehicle 10. The opening/closing body 12 is called a "tailgate", a "rear gate", a "bag door", or the like, but is referred to as "tailgate" in this specification.

The vehicle 10 is equipped with a power tailgate device 13 that rotates (opens or closes) the tailgate 12 in the directions indicated by the solid and broken arrows in FIG. 2. The power tailgate device 13 includes an actuator 13a with a speed reducer that opens or closes the tailgate 12, a controller 13b controlling the actuator 13a based on an operation of a switch (not shown), and a pair of touch sensor units 20 for detecting an obstacle BL. That is, the touch sensor unit 20 according to the present embodiment is one of the components of the power tailgate device 13 mounted on the vehicle 10.

As shown in FIG. 1, the touch sensor units 20 are provided on the outer peripheral surface of the tailgate 12. Specifically, the touch sensor units 20 are respectively provided on two side surfaces of the tailgate 12 in the vehicle width direction. More specifically, the touch sensor units 20 are provided on two curved side surfaces (edges) of the tailgate 12 along the shapes of the side surfaces. Thus, when the obstacle BL is caught between the rear opening 11 and the tailgate 12, the obstacle BL is detected by the touch sensor unit 20. The touch sensor unit 20 outputs a detection signal when detecting the obstacle BL. The detection signal output from the touch sensor unit 20 is input to the controller 13b. The controller 13b to which the detection signal is input drives open the tailgate 12 that is being driven to close, or stops the tailgate 12 that is being driven to close there regardless of the operation state of the operation switch.

Figure 3:
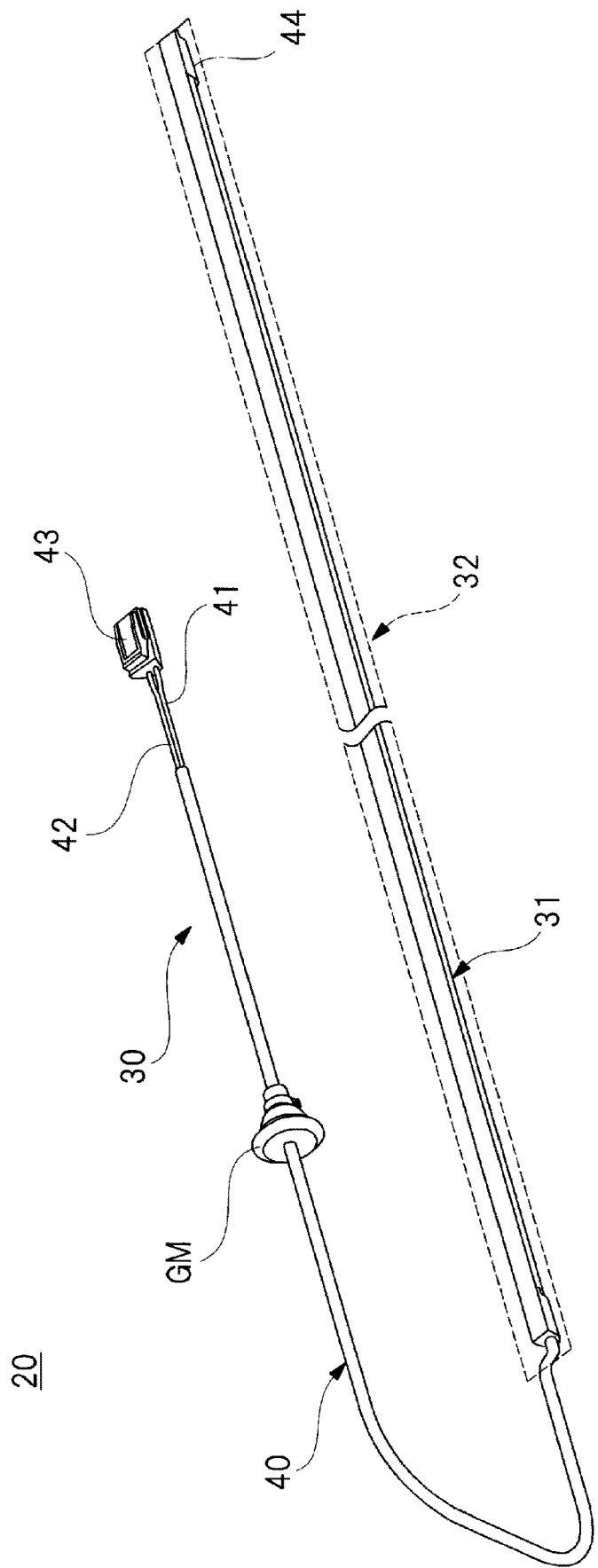
FIG. 3 is a perspective view showing a configuration of the touch sensor unit.

As shown in FIG. 3, the touch sensor unit 20 includes a sensor body 30, a sensor holder 31, and a bracket 32. The sensor body 30, the sensor holder 31, and the bracket 32 are integrated.

The bracket 32 shown in FIG. 3 is formed of a resin material such as plastic, and has substantially the same length as the side surface (edge) of the tailgate 12 (FIG. 1 and FIG. 2) and presents a plate-shaped appearance as a whole. As shown in FIG. 3, a part of the sensor body 30 in the longitudinal direction is fixed to the sensor holder 31 while the remaining part is not fixed to the sensor holder 31. Then, the sensor holder 31 to which a part of the sensor body 30 is fixed is fixed (joined) to the bracket 32. In the following description, a part of the sensor body 30 in the longitudinal direction, which is not fixed to the sensor holder 31, may be referred to as a "lead-out part" to be distinguished from other parts. However, such distinction is merely for convenience of explanation.

The touch sensor unit 20 having the basic structure as described above is attached to the vehicle 10 by fixing (joining) the bracket 32 to the edge of the tailgate 12 (FIG. 1 and FIG. 2). At this time, the lead-out part of the sensor body 30 is drawn to the inner side of the tailgate 12 from a lead-in hole provided in the tailgate 12. Further, the lead-in hole with the lead-out part drawn thereinto is closed by a grommet GM attached to the lead-out part. Hereinafter, the touch sensor unit 20 will be described in more detail.

As shown in FIG. 3, the sensor body 30 constituting the touch sensor unit 20 has a tubular insulator 40, a plurality of electrodes 41 and 42 which are provided inside the tubular insulator 40 and come into contact with each other as the tubular insulator 40 is elastically deformed, and a connector 43. A part of the tubular insulator 40 in the longitudinal direction, which includes the electrodes 41 and 42 therein, is embedded in the sensor holder 31. The sensor holder 31 is formed of insulating rubber and has elasticity. That is, the sensor holder 31 is elastically deformed when an external force is applied, and returns to the original shape when the external force is removed. In addition, the connector 43 is connected to another connector (not shown). By connecting the connector 43 to another connector, the touch sensor unit 20 is electrically connected to the controller 13b (FIG. 1 and FIG. 2), allowing the detection signal output from the touch sensor unit 20 to be input to the controller 13b.

Figure 4:
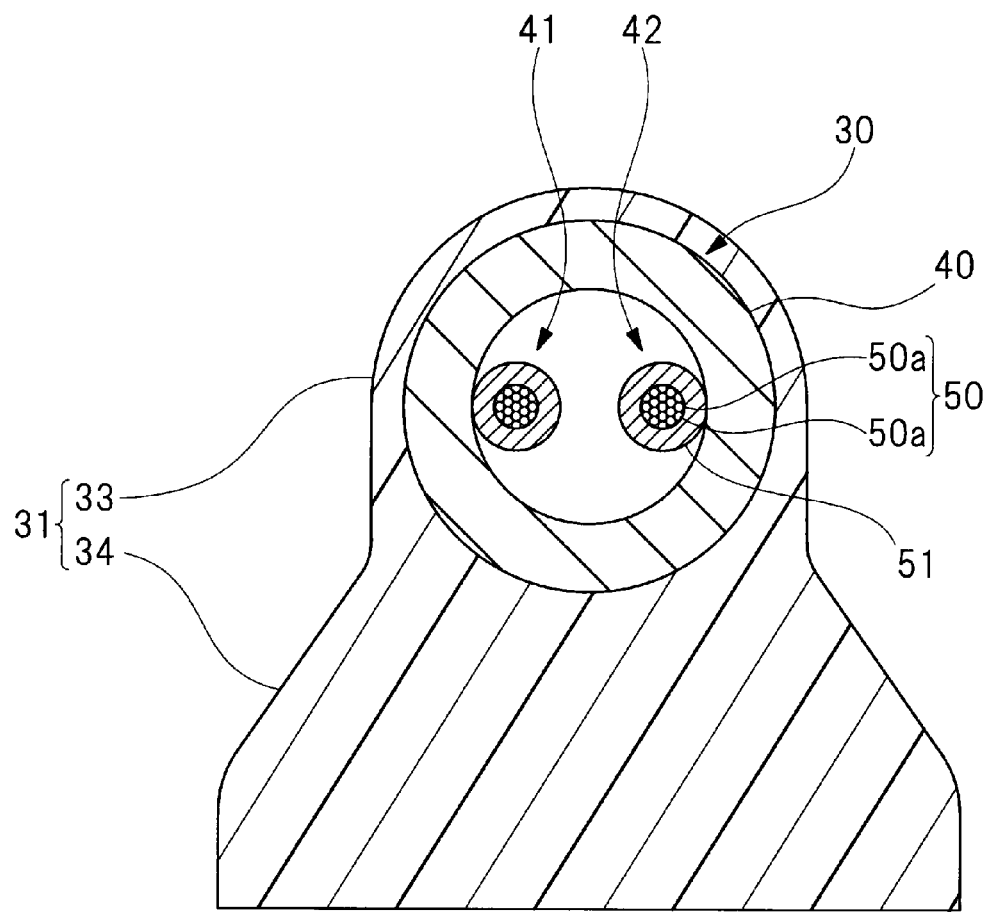
FIG. 4 is an enlarged cross-sectional view showing a structure of a sensor body and a sensor holder.

As shown in FIG. 4, the sensor holder 31 has a housing part 33 and a base part 34 that are integrally formed. The housing part 33 is hollow, and the sensor body 30 is embedded in the housing part 33 and the base part 34 is joined to the bracket 32 (FIG. 3). The tubular insulator 40 shown in FIG. 4 is a tube composed of insulating rubber and has elasticity. That is, the tubular insulator 40 is elastically deformed when an external force is applied, and returns to the original shape when the external force is removed. Further, the inner diameter of the tubular insulator 40 is about three times the outer diameter of the electrodes 41 and 42.

Figure 5:
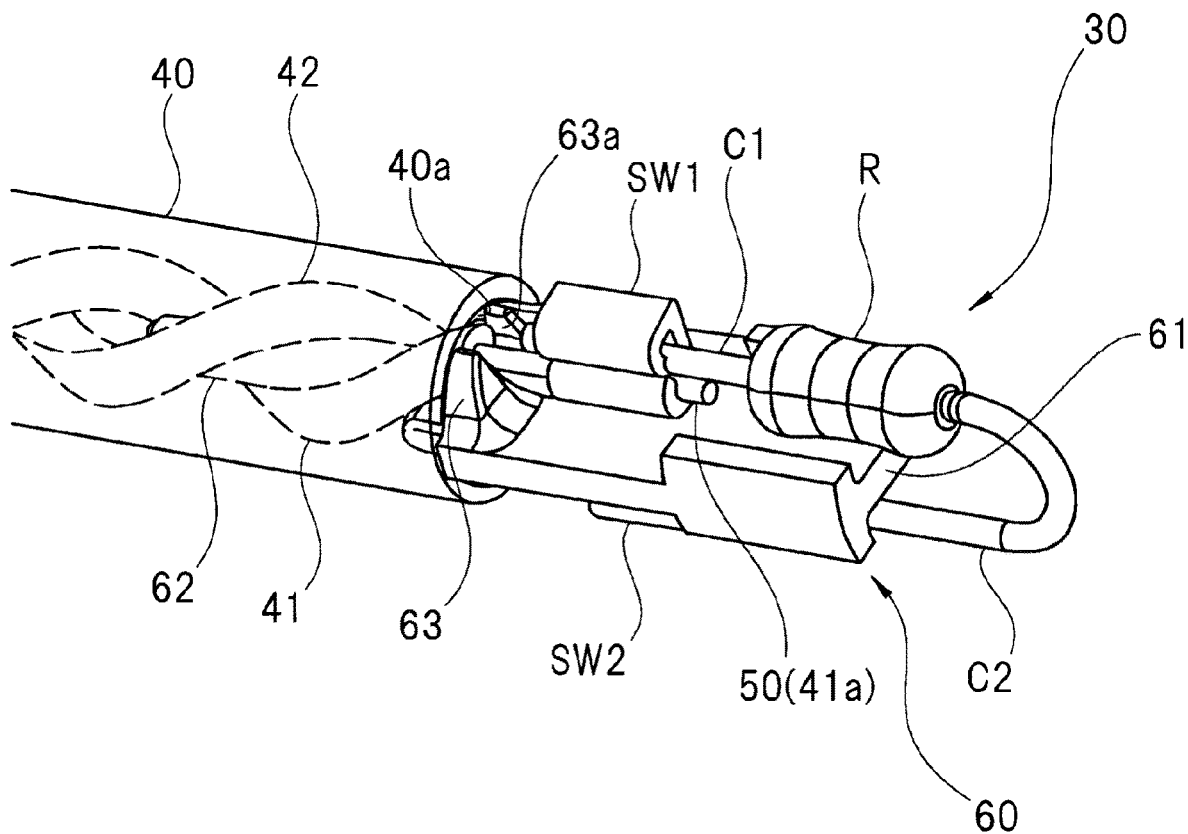
FIG. 5 is an explanatory view showing the structure of the sensor body.
Figure 6:
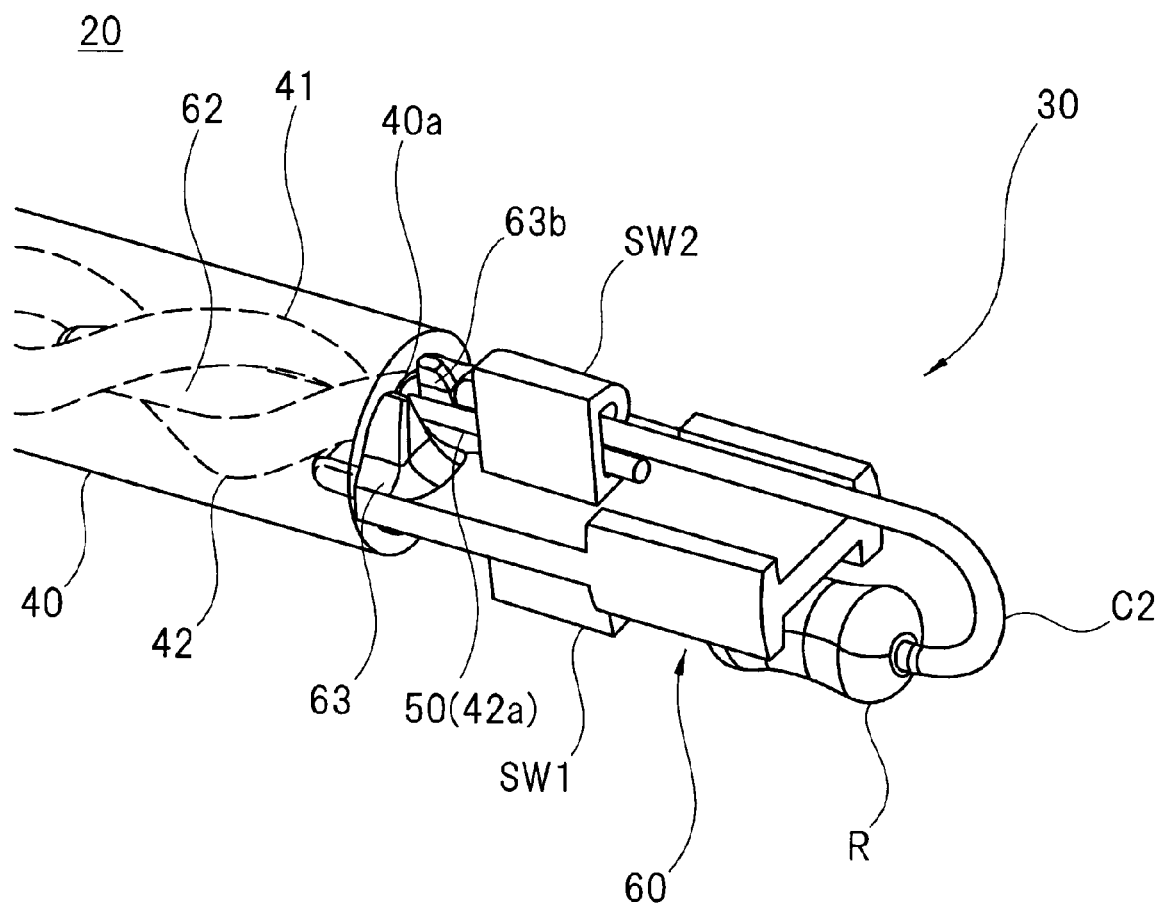
FIG. 6 is another explanatory view showing the structure of the sensor body.

As shown in FIG. 5 and FIG. 6, the electrodes 41 and 42 housed in the tubular insulator 40 are linear electrodes. The two linear electrodes 41 and 42 are provided spirally inside the tubular insulator 40, and usually, repeatedly intersect each other in a non-contact state. As shown in FIG. 4, the outer peripheral surface of each of the linear electrodes 41 and 42 is fixed (welded) to the inner peripheral surface of the tubular insulator 40, and there is a gap between the two linear electrodes 41 and 42 which is set so that another similar linear electrode may fit in.

As shown in FIG. 4, each of the linear electrodes 41 and 42 includes a core wire 50 composed of a plurality of strands 50a twisted together, and a covering layer (sheath 51) covering the core wire 50. The strand 50a in the present embodiment is a copper wire. That is, the core wire 50 in the present embodiment is a stranded wire composed of a plurality of copper wires. Further, the sheath 51 in the present embodiment is formed of a conductive resin extruded around the core wire 50.

As described above, the tubular insulator 40 that houses the linear electrodes 41 and 42 has elasticity, and the housing part 33 of the sensor holder 31 that houses the sensor body 30 including the tubular insulator 40 also has elasticity. Therefore, when the housing part 33 of the sensor holder 31 receives an external force of a certain level or more and is elastically deformed (collapsed), the external force is applied to the tubular insulator 40 accordingly. Then, the tubular insulator 40 is elastically deformed (collapsed), and the two linear electrodes 41 and 42 come close to each other and come into contact with each other in the tubular insulator 40. Specifically, the sheath 51 of one linear electrode 41 and the sheath 51 of the other linear electrode 42 come into contact with each other. As a result, the two linear electrodes 41 and 42 are electrically connected (short-circuited).

As shown in FIG. 5 and FIG. 6, the core wires 50 of the linear electrodes 41 and 42 are drawn out from one opening 40a of the tubular insulator 40. Each of the two core wires 50 drawn out from the opening 40a of the tubular insulator 40 is a part of the core wire 50 exposed to the outside by partially removing the sheath 51 (FIG. 4) of the linear electrodes 41 and 42, and corresponds to the connection wire in the disclosure. Thus, in the following description, the exposed portion of the core wire 50 in the linear electrode 41 is referred to as a "connection wire 41a", and the exposed portion of the core wire 50 in the linear electrode 42 is referred to as a "connection wire 42a".

Figure 7:
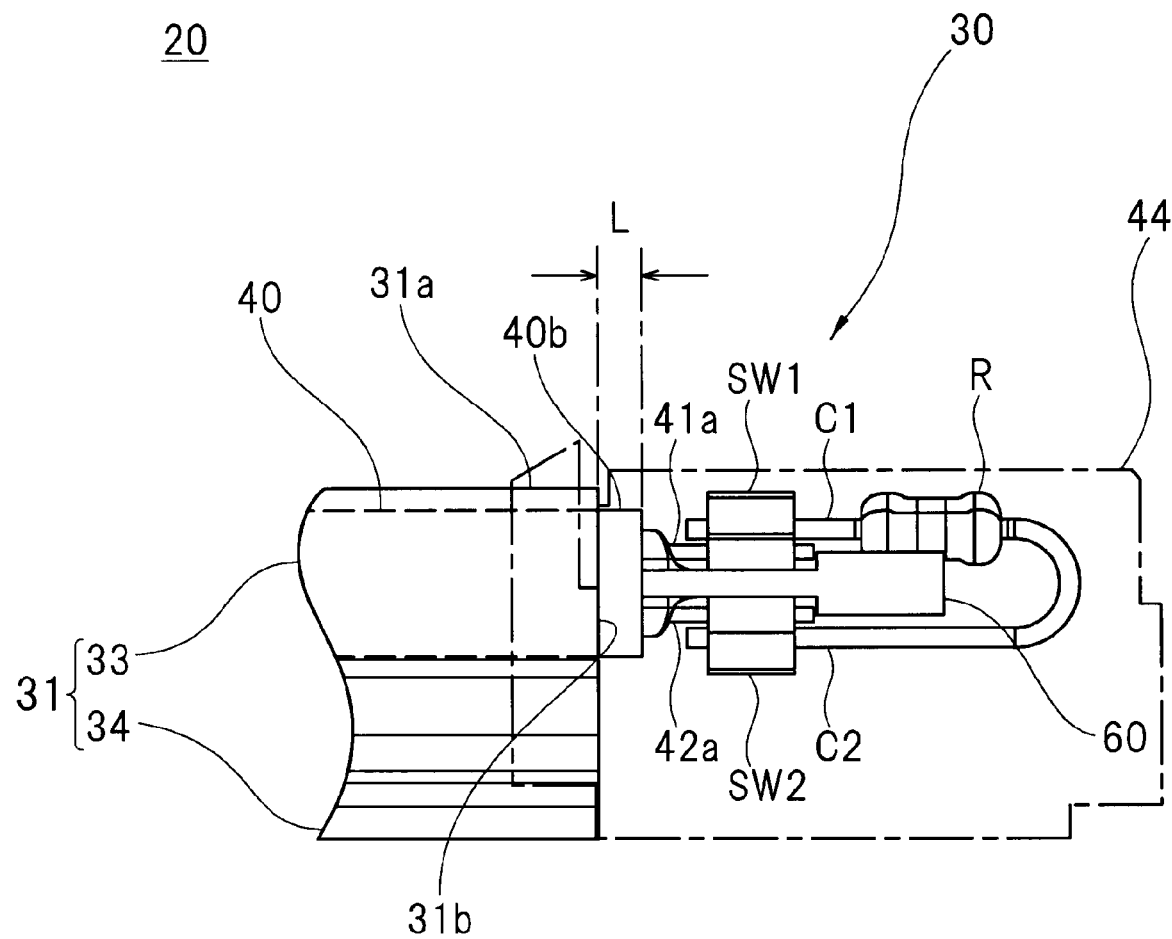
FIG. 7 is another explanatory view showing the structure of the sensor body.

As shown in FIG. 7, the touch sensor unit 20 further has a resistor R as an electrical component disposed outside the sensor holder 31. One end of the resistor R is provided with a short connection part C1, and the other end of the resistor R is provided with a long connection part C2. The long connection part C2 is folded 180 degrees and is arranged in parallel to the short connection part C1. As shown in FIG. 5 and FIG. 7, the connection wire 41a of the linear electrode 41 and the short connection part C1 are connected to each other by a connection member SW1. As shown in FIG. 6 and FIG. 7, the connection wire 42a of the linear electrode 42 and the long connection part C2 are connected to each other by another connection member SW2.

As shown in FIG. 7, a part of the sensor body 30 embedded in the housing part 33 of the sensor holder 31 protrudes from the end 31a of the sensor holder 31. Specifically, the end 40b of the tubular insulator 40 protrudes from the end surface 31b of the sensor holder 31. In other words, a part of the tubular insulator 40 protruding from the end surface 31b of the sensor holder 31 is the end 40b of the tubular insulator 40.

Figure 8:
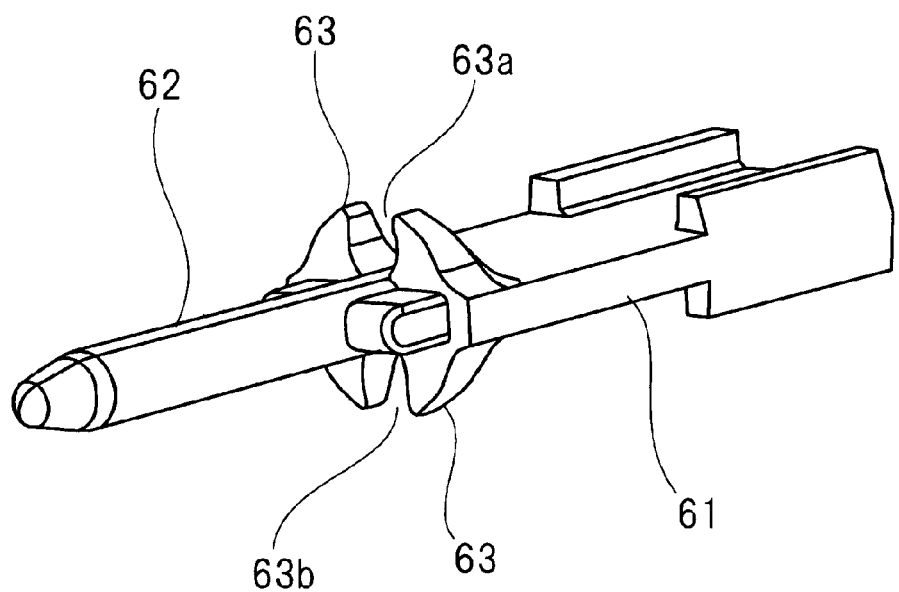
FIG. 8 is a perspective view showing a separator.

As shown in FIG. 5 to FIG. 7, the touch sensor unit 20 further has a separator 60 as an insulating member. As shown in FIG. 8, the separator 60 has a substantially flat plate-shaped separator body 61, and a substantially columnar insertion protrusion 62 that protrudes from one end of the separator body 61 in the longitudinal direction. However, the separator body 61 and the insertion protrusion 62 are integrally formed of an insulating material such as plastic.

As shown in FIG. 5 and FIG. 6, the insertion protrusion 62 of the separator 60 is inserted between the two linear electrodes 41 and 42 housed in the tubular insulator 40 from the opening 40a of the tubular insulator 40. Further, the separator body 61 of the separator 60 is interposed between the two connection wires 41a and 42a and prevents contact (short circuit) between the connection wires 41a and 42a. Specifically, the resistor R, the short connection part C1, the connection wire 41a, and the connection member SW1 are disposed on one side (upper side) of the separator body 61, and the long connection part C2, the connection wire 42a, and the connection member SW2 are disposed on the other side (lower side) of the separator body 61.

As shown in FIG. 8, two closing parts 63 are formed at the tip of the separator body 61 so as to surround the root of the insertion protrusion 62. Then, in the center of the closing part 63 formed on the upper side of the separator body 61, a concave part 63a is provided for avoiding the connection wire 41a (FIG. 5). In the center of the closing part 63 formed on the lower side of the separator body 61, a concave part 63b is formed for avoiding the connection wire 42a (FIG. 6). The two concave parts 63a and 63b are provided at positions different by 180 degrees in the circumferential direction of the insertion protrusion 62.

As shown in FIG. 5, the connection wire 41a is drawn out on the separator body 61 through the inner side of the concave part 63a and is connected to the short connection part C1. In addition, as shown in FIG. 6, the connection wire 42a is drawn out on the separator body 61 through the inner side of the concave part 63b and is connected to the long connection part C2. Moreover, as shown in FIG. 5 and FIG. 6, the front surfaces of the two closing parts 63 abut against the end surface of the tubular insulator 40. In other words, the insertion protrusion 62 is inserted into the tubular insulator 40 until the front surfaces of the two closing parts 63 abut against the end surface of the tubular insulator 40. As a result, the opening 40a of the tubular insulator 40 is closed by the closing parts 63. More specifically, most of the gap between the inner peripheral surface of the tubular insulator 40 and the outer peripheral surfaces of the linear electrodes 41 and 42 (sheaths 51) in the opening 40a of the tubular insulator 40 is closed by the closing parts 63.

In the following description, the connection wires 41a and 42a, the resistor R, the connection members SW1 and SW2, and the separator body 61 may be collectively referred to as an "electrical connection part".

Figure 9:
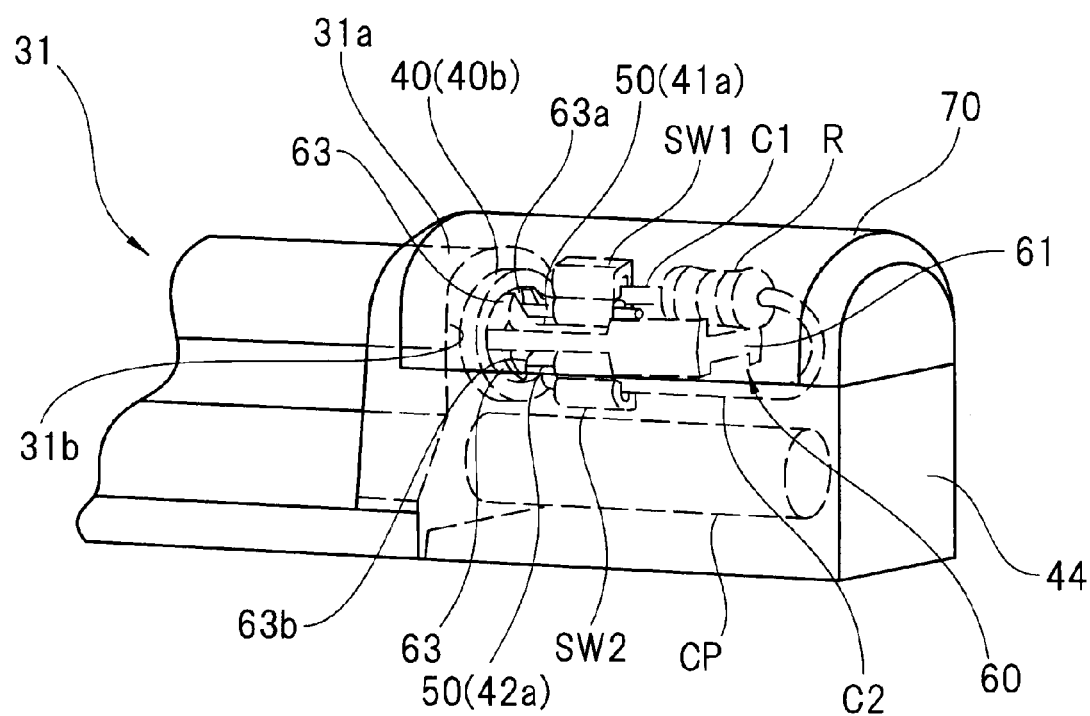
FIG. 9 is a perspective view showing a mold part and a cover member.
Figure 10:
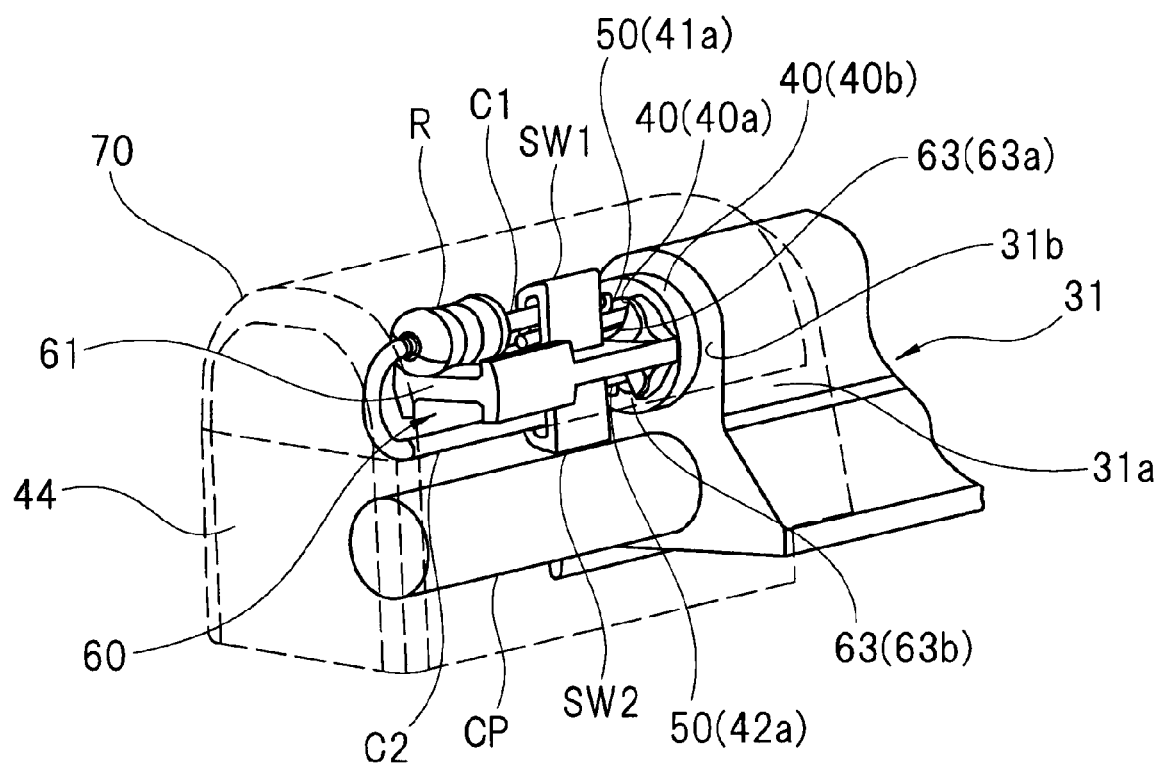
FIG. 10 is another perspective view showing the mold part and the cover member.

Referring to FIG. 3 again, a mold part 44 is provided on one end side of the touch sensor unit 20 in the longitudinal direction. The mold part 44 is, as shown in FIG. 9 and FIG. 10, a resin molded body including the end 31a of the sensor holder 31, the end 40b of the tubular insulator 40 protruding from the end surface 31b of the sensor holder 31, and the electrical connection part provided outside the sensor holder 31. That is, the end 31a of the sensor holder 31, the end 40b of the tubular insulator 40, and the electrical connection part are molded together with resin.

As described above, the mold part 44 extends between the end 31a of the sensor holder 31 and the end 40b of the tubular insulator 40. Further, the end 40b of the tubular insulator 40 protrudes from the end surface 31b of the sensor holder 31. Thus, the mold part 44 is in contact with not only the end surface of the tubular insulator 40 but also the outer peripheral surface of the tubular insulator 40 (the outer peripheral surface of the end 40b). As a result, the end 40b of the tubular insulator 40 is fixed to the sensor holder 31. That is, the mold part 44 not only waterproofs and protects the end of the touch sensor unit 20 including the electrical connection part but also functions as a fixing means for restricting the movement of the sensor body 30 including the tubular insulator 40 relative to the sensor holder 31.

From the viewpoint of functioning the mold part 44 as the above fixing means, the protruding length L (FIG. 7) of the end 40b of the tubular insulator 40 relative to the end surface 31b of the sensor holder 31 is preferably 0.1 mm to 2.0 mm, more preferably 0.5 mm to 1.0 mm, and even more preferably about 0.75 mm.

As shown in FIG. 9 and FIG. 10, the mold part 44 is covered with a cover member 70 that covers at least a part of the components of the electrical connection part via the mold part 44. In other words, the cover member 70 is provided around the mold part 44 including the electrical connection part therein, and covers a part of the surface of the mold part 44.

Figure 11:
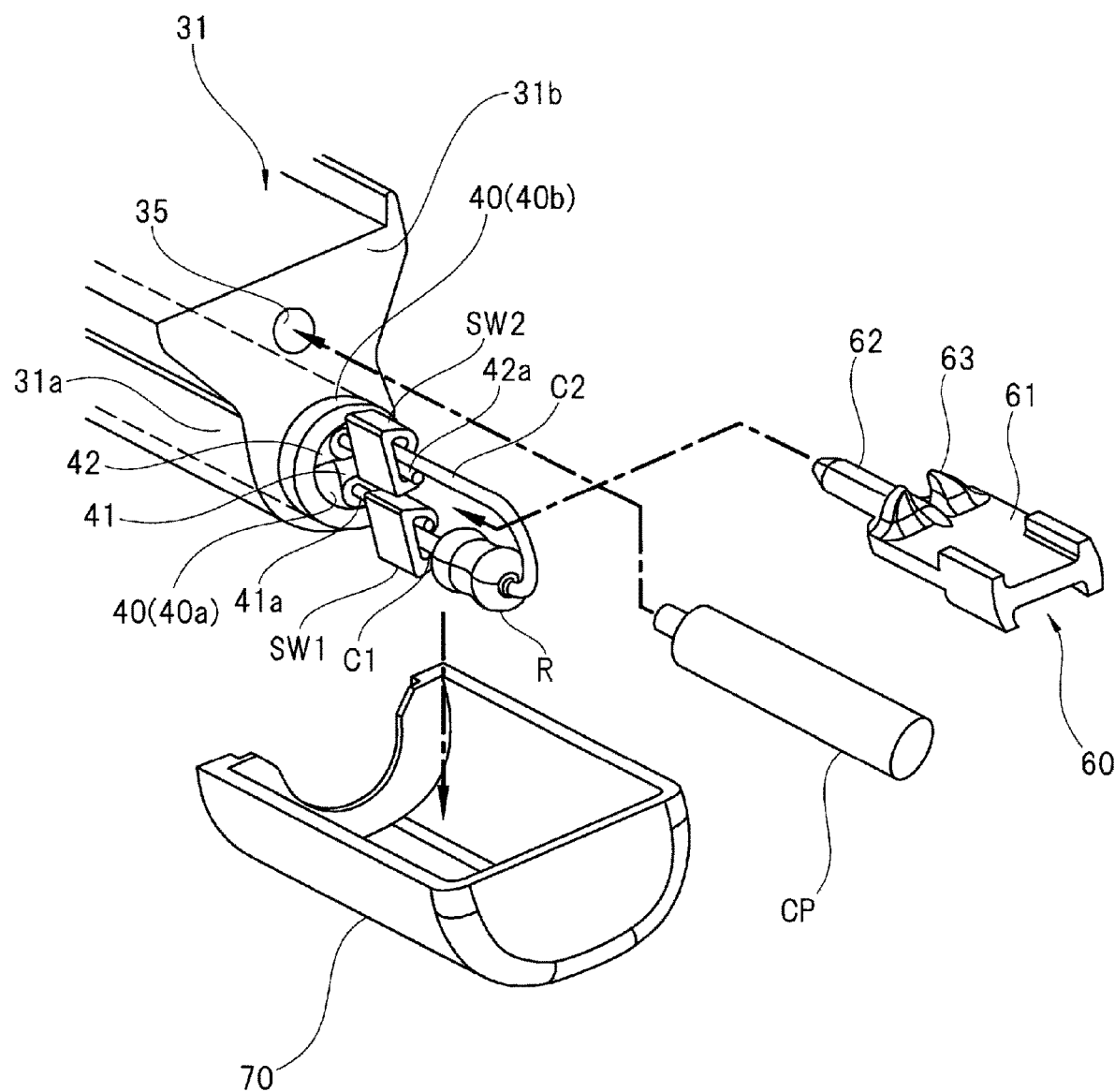
FIG. 11 is an explanatory view showing a molding process of the mold part.

The mold part 44 shown in FIG. 9 and FIG. 10 is a resin molded body made by injection molding using a mold. A molding process of the mold part 44 includes at least a "separator assembly process" and a "mold resin injection process". In the separator assembly process, as shown in FIG. 11, the separator 60 is arranged at a predetermined position in a predetermined direction. Specifically, the separator 60 is inserted between the body of the resistor R and the long connection part C2 so that the resistor R, the short connection part C1, the connection wire 41a, and the connection member SW1 are arranged on one side (upper side) of the separator body 61, and the long connection part C2, the connection wire 42a, and the connection member SW2 are arranged on the other side (lower side) of the separator body 61. Thereafter, the insertion protrusion 62 of the separator 60 is inserted between the two linear electrodes 41 and 42 in the tubular insulator 40 from the opening 40a of the tubular insulator 40. At this time, the insertion protrusion 62 is inserted into the tubular insulator 40 until the front surfaces of the closing parts 63 of the separator 60 abut against the end surface of the tubular insulator 40. As a result, the separator body 61 is interposed between the short connection part C1, the connection wire 41a, and the connection member SW1 and the long connection part C2, the connection wire 42a, and the connection member SW2, and prevents contact (short circuit) between these components. Further, the opening 40a of the tubular insulator 40 is closed by the closing parts 63 with substantially no gap. The tip of the insertion protrusion 62 is formed to be tapered to facilitate insertion between the linear electrodes 41 and 42. In addition, the diameter of the insertion protrusion 62 is slightly larger than the diameter of the linear electrodes 41 and 42, and enters the gap between the linear electrodes 41 and 42 while slightly pushing away the linear electrodes 41 and 42. Thus, the insertion protrusion 62 inserted between the two linear electrodes 41 and 42 does not come out accidentally.

Figure 12:
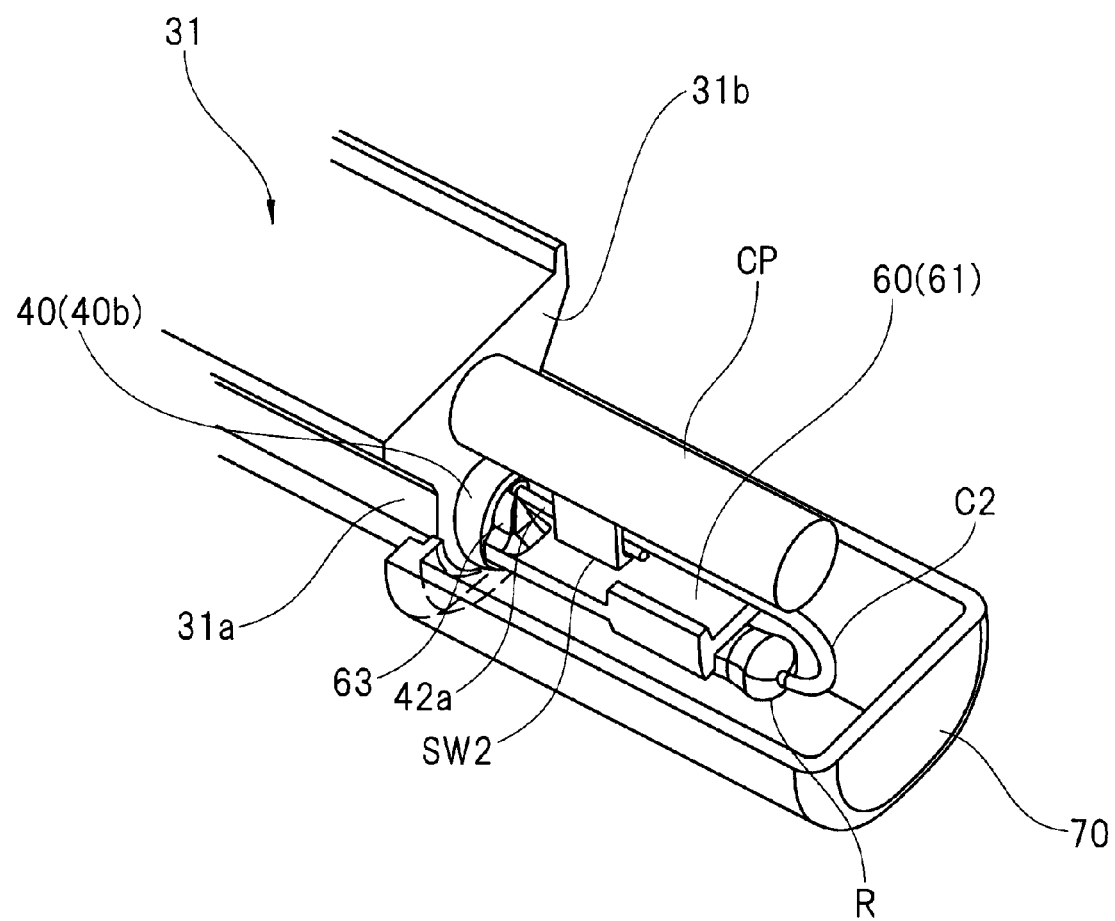
FIG. 12 is another explanatory view showing the molding process of the mold part.

In the mold resin injection process, as shown in FIG. 11 and FIG. 12, the end 31a of the sensor holder 31, the end 40b of the tubular insulator 40, and the electrical connection part are disposed on the inner side of the cover member 70 set in the mold (not shown). As shown in FIG. 11, an insertion hole 35 is formed in the sensor holder 31 over substantially the entire length thereof, and a core metal (not shown) is inserted into the insertion hole 35. Therefore, a cap CP that closes the insertion hole 35 is attached to the sensor holder 31 before the mold resin injection process. Specifically, a protrusion protruding from one end surface of the cap CP is press-fitted into the insertion hole 35. Thereby, the insertion hole 35 is closed and the mold resin is prevented from flowing into the insertion hole 35.

Thereafter, molten resin is injected into the mold to mold the mold part 44. At this time, the opening 40a of the tubular insulator 40 is closed by the closing parts 63 of the separator 60. Thus, the molten resin does not flow into the tubular insulator 40, and even if it flows into the tubular insulator 40, the amount is small.

Further, when the molten resin is injected into the mold, the pressure (injection pressure) of the molten resin acts on each part of the sensor holder 31 and the sensor body 30 disposed in the mold. For example, the injection pressure acts on the end 31a of the sensor holder 31 and the end 40b of the tubular insulator 40. The injection pressure acting on the outer peripheral surface of the end 31a of the sensor holder 31 (hereinafter referred to as "radial pressure") acts on the tubular insulator 40 via the end 31a and presses the tubular insulator 40. In addition, the injection pressure acting on the end surface of the tubular insulator 40 (hereinafter referred to as "axial pressure") pushes the tubular insulator 40 into the sensor holder 31.

Here, the end 40b of the tubular insulator 40 protrudes from the end surface 31b of the sensor holder 31 in advance. Thus, even if the radial pressure and the axial pressure act simultaneously, the entire end 40b of the tubular insulator 40 is not pushed into the sensor holder 31. Furthermore, if the flow of the molten resin in the mold is controlled so that the radial pressure acts before the axial pressure acts, it is also possible to completely or almost completely avoid pushing the end 40b of the tubular insulator 40 into the sensor holder 31.

Other Configurations

In one embodiment of the disclosure, a touch sensor unit is provided to include a sensor body; a sensor holder in which the sensor body is embedded; and an electrical component disposed outside the sensor holder and electrically connected to the sensor body. The sensor body includes a tubular insulator that is elastically deformed when an external force is applied, and a plurality of electrodes that are provided inside the tubular insulator and come into contact with each other as the tubular insulator is elastically deformed. Then, at least an end of the sensor holder, an end of the tubular insulator protruding from an end surface of the sensor holder, and the electrical component are molded together with resin.

According to an embodiment of the disclosure, a plurality of connection wires are provided, which are drawn out from the end of the tubular insulator and connected to the electrical component. Then, in addition to the end of the sensor holder, the end of the tubular insulator, and the electrical component, the connection wires are also molded together with resin.

According to another embodiment of the disclosure, an insulating member is provided, which is interposed between the plurality of connection wires and prevents contact between the connection wires. Then, in addition to the end of the sensor holder, the end of the tubular insulator, the electrical component, and the connection wires, the insulating member is also molded together with resin.

The disclosure realizes a touch sensor unit having a mold part that can restrict the movement of the sensor body embedded in the sensor holder.

The disclosure is not limited to the above embodiment, and various changes can be made without departing from the scope of the disclosure.

What is claimed is:

1. A touch sensor unit, comprising:
 a sensor body;
 a sensor holder in which the sensor body is embedded; and
 an electrical component disposed outside the sensor holder and electrically connected to the sensor body,
 wherein the sensor body comprises a tubular insulator that is elastically deformed when an external force is applied, and a plurality of electrodes that are provided inside the tubular insulator and come into contact with each other as the tubular insulator is elastically deformed, and
 at least an end of the sensor holder, an end of the tubular insulator protruding from an end surface of the sensor holder, and the electrical component are molded together with resin.

2. The touch sensor unit according to claim 1, comprising a plurality of connection wires drawn out from the end of the tubular insulator and connected to the electrical component,
 wherein in addition to the end of the sensor holder, the end of the tubular insulator, and the electrical component, the connection wires are also molded together with resin.

3. The touch sensor unit according to claim 2, comprising an insulating member interposed between the plurality of connection wires and preventing contact between the connection wires,
 wherein in addition to the end of the sensor holder, the end of the tubular insulator, the electrical component, and the connection wires, the insulating member is also molded together with resin.

* * * * *